United States Patent
Kondapalli et al.

(10) Patent No.: US 7,468,616 B1
(45) Date of Patent: Dec. 23, 2008

(54) CIRCUIT FOR AND METHOD OF GENERATING A DELAY IN AN INPUT/OUTPUT PORT OF AN INTEGRATED CIRCUIT DEVICE

(75) Inventors: Venu Kondapalli, Sunnyvale, CA (US); Prasad Rau, Saint Louis, MO (US)

(73) Assignee: Xilinx, Inc., San Jose, CA (US)

(*) Notice: Subject to any disclaimer, the term of this patent is extended or adjusted under 35 U.S.C. 154(b) by 147 days.

(21) Appl. No.: 11/513,568

(22) Filed: Aug. 30, 2006

(51) Int. Cl.
*H03K 19/0175* (2006.01)
*H03L 7/00* (2006.01)

(52) U.S. Cl. .................................. 326/82; 327/161
(58) Field of Classification Search ............ 326/82, 326/83, 86, 87, 113; 327/161
See application file for complete search history.

(56) References Cited

U.S. PATENT DOCUMENTS

| | | | | |
|---|---|---|---|---|
| 4,458,165 A | * | 7/1984 | Jackson | 327/276 |
| 4,606,584 A | * | 8/1986 | Kowal et al. | 303/22.8 |
| 5,365,204 A | * | 11/1994 | Angiulli et al. | 331/57 |
| 5,812,595 A | * | 9/1998 | Jandu | 375/219 |
| 2002/0175738 A1 | * | 11/2002 | Cyrusian | 327/337 |
| 2004/0004239 A1 | * | 1/2004 | Madurawe | 257/298 |

* cited by examiner

*Primary Examiner*—James H. Cho
*Assistant Examiner*—Dylan White
(74) *Attorney, Agent, or Firm*—John J. King (57) ABSTRACT

A circuit for generating a delayed output in an input/output port of a device adapted to implement circuits operating on a range of voltages is disclosed. The circuit comprises a first terminal of a delay stage of said input/output port coupled to receive a signal to be output by the circuit; a first pass gate coupled to the first terminal; a capacitor having a first terminal coupled to the output of the first pass gate and a second terminal coupled to ground; a second pass gate coupled to the first terminal of the capacitor; and a second terminal of said delay stage of said input/output port coupled to the second pass gate and outputting a delayed signal based upon the second pass gate. A method of generating a delayed output in an input/output stage of a device adapted to implement circuits operating on a range of voltages is also disclosed.

19 Claims, 5 Drawing Sheets

CIRCUIT FOR AND METHOD OF GENERATING A DELAY IN AN INPUT/OUTPUT PORT OF AN INTEGRATED CIRCUIT DEVICE

FIELD OF THE INVENTION

The present invention relates generally to integrated circuits, and in particular, to a circuit for and method of generating a delay in an input/output port of an integrated circuit device.

BACKGROUND OF THE INVENTION

Integrated circuit devices typically have a number of input/output pins to generate output signals. Output signals of an integrated circuit are typically switched simultaneously in response to a clock signal. Such simultaneously switching of outputs lead to large transient currents, which are often difficult to control. In particular, power and ground noise is generated in on-chip power and ground buses when the signals at the outputs switch logic states simultaneously. When a significant number of drivers switch at the same time, an increased current draw on the power supply may cause a dip or negative spike in the voltage supply to the chip. This dip in power supply voltage may propagate as noise through both active and quiet drivers, and may cause false switching in the system. With system speeds increasing and the demands to transmit more data, destructive simultaneous switching noise has become a greater concern.

Conventional methods control the large transient currents associated with simultaneously switched outputs by controlling the slew rate of the output signals. For example, a staged driver may be implemented, where a portion of the driver is turned on after a fixed delay to reduce the simultaneous switching noise. A chain of inverters has been used in conventional devices to provide a delay to control the slew rate. The transistors of the inverters in the delay circuit have a turn-on time which is dependent upon the bias voltage of the transistor. As the bias voltage varies, the delay provided by the delay stage comprising inverters will vary. For example, a transistor will turn on faster with a higher bias voltage, while the transistor will turn on slower with a lower bias voltage. Accordingly, the use of inverters in delay stages of input/output ports leads to variable delays depending upon the supply voltage.

Simultaneously switched outputs affect many different types of integrated circuits. For example, a programmable logic device is one type of integrated circuit which is designed to be user-programmable so that users may implement logic designs of their choices. One type of programmable logic device is a Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose.

While programmable logic devices are beneficial because they enable the implementation of a variety of circuits selected by a user, such flexibility creates challenges in implementing input/output ports. That is, because a programmable logic device is intended to incorporate a variety of circuits, a wide range of I/O interfaces needs to be supported on a single I/O structure. However, because a delay created by a delay stage of a conventional circuit varies based upon voltage, providing a known delay for reducing simultaneous switching noise using a conventional circuit is difficult. Further, as operating voltages for some applications continue to decrease, the delay necessary in the I/O ports needs to be reduced. That is, because the switching speed of transistors is reduced at lower operating voltages, a delay may not be necessary. For example, in higher performance I/O interfaces employed in memory applications using lower operating voltages, such as voltages of 1.5 or 1.8 volts, it may not be necessary to use a delay to eliminate simultaneous switching noise. Therefore, the performance of I/O interfaces needs to be improved by maintaining a fixed delay which is independent of a bias voltage, and minimizing the delay for certain lower bias voltages.

Accordingly, there is a need for an improved circuit for and method of generating a delay in an input/output port of an integrated circuit device.

SUMMARY OF THE INVENTION

A circuit for generating a delayed output in an input/output port of a device adapted to implement circuits operating on a range of voltages is disclosed. The circuit comprises a first terminal of a delay stage of the input/output port coupled to receive a signal to be output by the circuit; a first pass gate coupled to the first terminal; a capacitor having a first terminal coupled to the output of the first pass gate and a second terminal coupled to ground; a second pass gate coupled to the first terminal of the capacitor; and a second terminal of a delay stage of the input/output port coupled to the output of the second pass gate and outputting a delayed signal. The first pass gate and the second pass gate may comprise complementary metal oxide semiconductor (CMOS) pass gates. The circuit may further comprise a bypass gate coupled to the first terminal and the second terminal.

According to an alternate embodiment, a circuit for generating a delayed output in an input/output port of a device adapted to implement circuits operating on a range of voltages comprises a first terminal coupled to receive a signal to be output by the input/output port; a first delay path comprising a first pass gate coupled to the first terminal, a first capacitor coupled to the output of the first pass gate, and a second pass gate coupled to the first capacitor at the output of the first pass gate; a second delay path coupled to the first terminal; and a second terminal coupled to the output of the first and second delay paths to generate a delayed signal based upon the signal received at the first terminal. The circuit may further comprise a second delay path comprising a series of inverters. Also, the first and second delay paths may comprise bypass paths.

A method of generating a delayed output in an input/output port of a device adapted to implement circuits operating on a range of voltages is described. The method comprises steps of setting a fixed input voltage at an input/output block of the device; setting a variable voltage at the input/output block of the device; providing a delay stage to an output driver of an input/output port of the input/output block, the delay stage comprising a delay path and a bypass path; and determining whether to select the delay path or the bypass path to generate a signal to the output driver. The method may further comprise selecting the delay path and generating a delayed output signal which is independent of the variable voltage. The step of determining whether to select the delay path or the bypass path comprises a step of determining whether to select the bypass path based upon a level of the variable voltage and performance requirements.

DETAILED DESCRIPTION OF THE DRAWINGS

Figure 1:
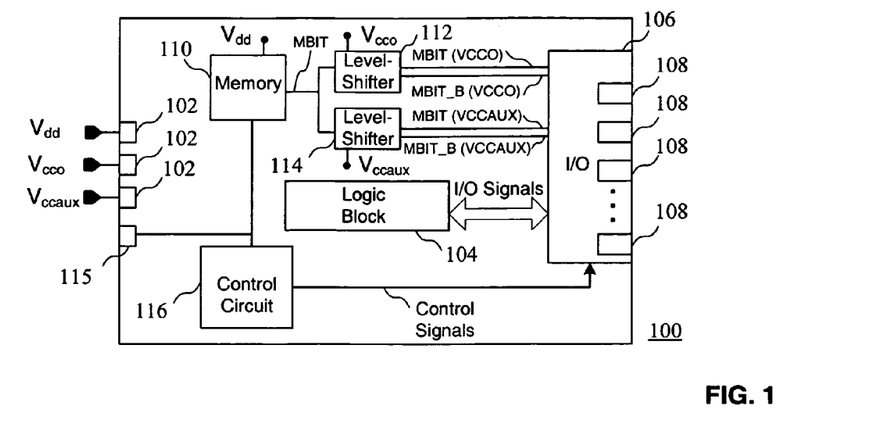
FIG. 1 is a block diagram of an integrated circuit according to an embodiment of the present invention.

Turning first to FIG. 1, a block diagram of an integrated circuit according to an embodiment of the present invention is shown. In particular, an integrated circuit 100 receives a plurality of input voltages at one or more input ports 102, including $V_{dd}$, $V_{cco}$, and $V_{ccaux}$. That is, in addition to the positive supply voltage $V_{dd}$, an auxiliary voltage $V_{ccaux}$ comprises a fixed voltage, while the variable supply voltage $V_{cco}$ is a voltage that depends upon an I/O standard implemented by the integrated circuit, and has a predetermined voltage level. Although a single variable voltage is shown, a number of other reference voltages may be coupled to the integrated circuit or internally generated. A logic block 104 comprises the various circuits of the integrated circuit, and may be any circuit implemented in fixed or programmable logic, for example. The output of the logic circuit is coupled to an input/output block 106 having a plurality of input/output ports 108. As will be described in more detail below, the input/output ports 108 comprise a delay element for delaying the output signal to avoid simultaneous switching noise. In particular, the delay element will provide a fixed delay regardless of the supply voltage $V_{cco}$ or provide a minimal delay if $V_{cco}$ is low enough that additional delay is not necessary. A memory 110 which is biased by the supply voltage $V_{dd}$ stores a value MBIT. As will be described in detail below, the value of MBIT will be used to determine which path of a delay stage will be used. The MBIT value to be stored in the memory may be downloaded as a part of a configuration bitstream by way of an input/output port 115, for example. As will also be described in more detail below, different transistors of the delay stage may be separately biased. Accordingly, a first level shifter 112 which is biased by $V_{cco}$ will receive the value of MBIT, and generate level shifted values comprising MBIT (VCCO) and MBIT_B(VCCO). Similarly, a level shifter 114 which is biased by $V_{ccaux}$ will receive the value of MBIT and generate level shifted values MBIT(VCCAUX) and MBIT_B (VCCAUX). Finally, the input/output block 106 is controlled by a control circuit 116. While the circuits and methods described below find particular application with programmable logic devices where the input/output ports may operate on a wide range of voltages, the integrated circuit 100 may be any other type of integrated circuit, such as an application specific integrated circuit (ASIC).

Figure 2:
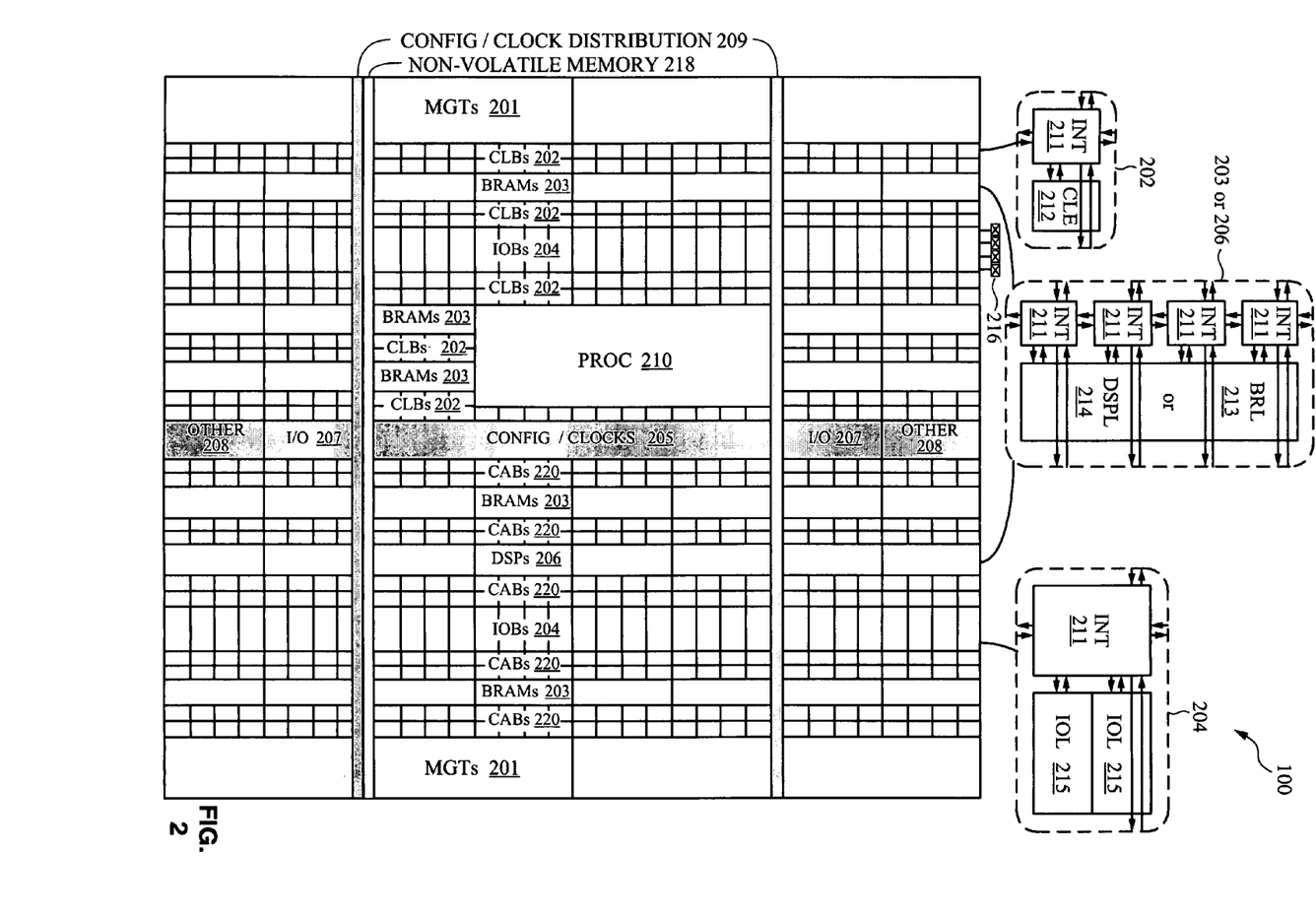
FIG. 2 is a block diagram of programmable logic device according to an embodiment of the present invention.

Turning now to FIG. 2, a block diagram of programmable logic device according to an embodiment of the present invention is shown. The FPGA architecture 100 of FIG. 2 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210). The logic circuit 104 may be implemented in the CLBs, for example, while control circuits may also be implemented in CLBs or by a dedicated processor block. Similarly, the I/O ports 108 may be implemented in the I/O blocks 204.

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 may include a configurable logic element (CLE 212) that may be programmed to implement user logic plus a single programmable interconnect element (INT 211). A BRAM 203 may include a BRAM logic element (BRL 213) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 206 may include a DSP logic element (DSPL 214) in addition to an appropriate number of programmable interconnect elements. An IOB 204 may include, for example, two instances of an input/output logic element (IOL 215) in addition to one instance of the programmable interconnect element (INT 211). As will be clear to those of skill in the art, the actual I/O pads 216 connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. Some FPGAs utilizing the architecture illustrated in FIG. 2 include additional logic blocks that disrupt the regular columnar structure making up a large part of the FPGA. The additional logic blocks may be programmable blocks and/or dedicated logic. For example, the processor block PROC 210 shown in FIG. 2 spans several columns of CLBs and BRAMs. Finally, a non-volatile memory 218 may be employed for on-chip storage of configuration data which is used to configure the configuration logic blocks or other programmable tiles as described above.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic. Similarly the circuits and methods of the present invention may be implemented in any device, including any type of integrated circuit having programmable logic.

Figure 3:
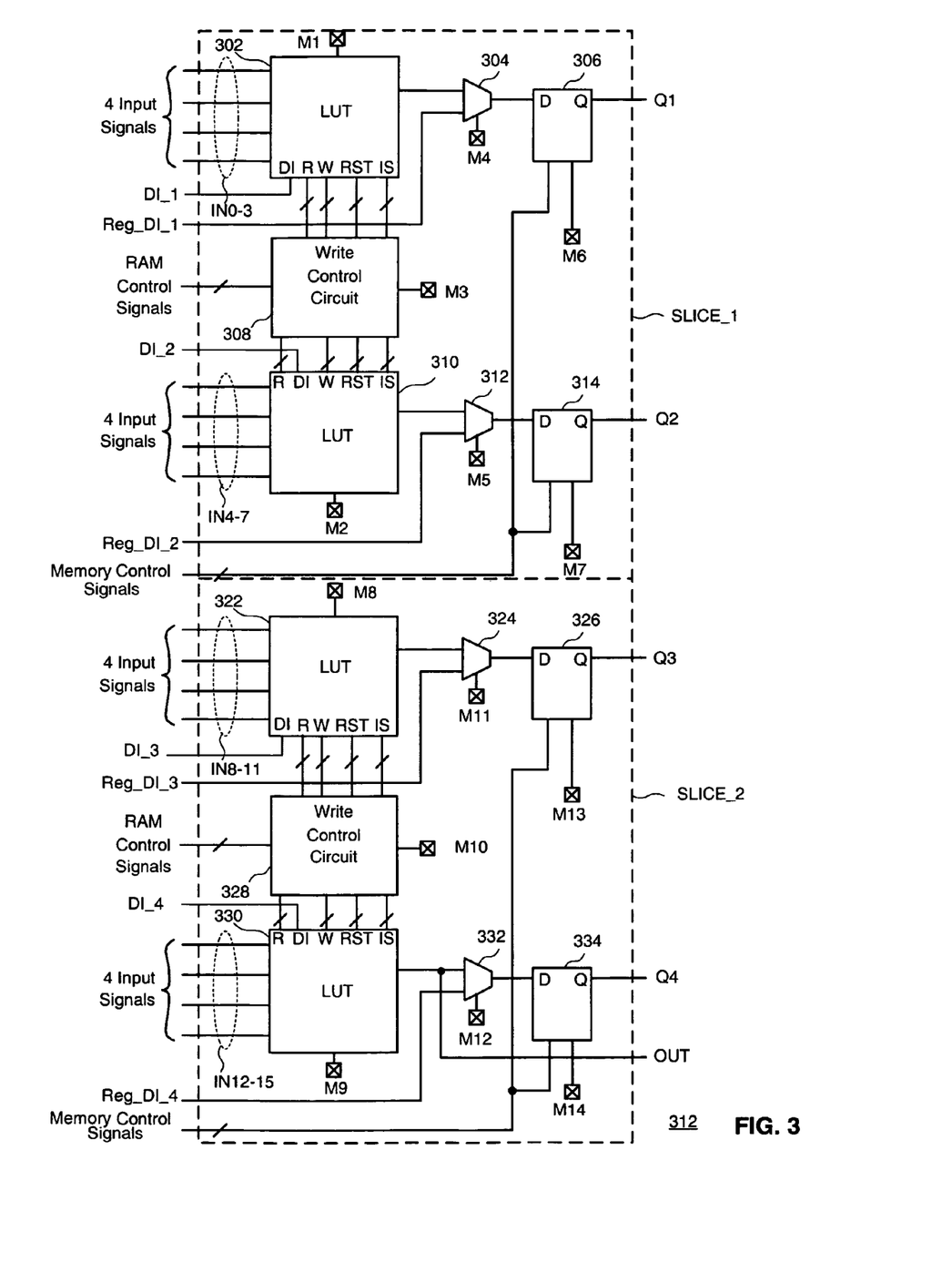
FIG. 3 is a block diagram of a configurable logic element of the programmable logic device of FIG. 2 according to an embodiment of the present invention.

Turning now to FIG. 3, a block diagram of a configurable logic element of the programmable logic device of FIG. 2 according to an embodiment of the present invention is shown. In particular, FIG. 3 illustrates in simplified form a configurable logic element of a configuration logic block 202 of FIG. 2. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by an input terminal DI_1, DI_2 to the data input (DI) terminal of the associated function generator. Each function generator provides an output signal to an associated multiplexer, which selects between the output signal function generator and an associated register direct input signal Reg_DI_1, Reg_DI_2 from the programmable interconnect element. Thus, each function generator may be optionally bypassed. When in look-up table mode, each function generator implemented as a look-up table has four data input signals IN0-IN3. Slice 1 comprises a function generator implemented as a LUT 302 coupled to a multiplexer 304. In particular, the LUT 302 receives 4 input signals which are decoded to generate an output associated with data stored in the LUT at the address designated by the input signals. The multiplexer 304 is adapted to receive the output of LUT 302 and a registered value of Reg_DI_1. The output of the multiplexer 304 is coupled to a register 306 which generates an output Q1.

A Write Control Circuit 308 is coupled to receive RAM control signals and generate signals to control the LUT 302. In addition to a data input (DI) coupled to receive RAM_DI_1 and conventional read and write control signals coupled to a read enable input (R) and a write enable input (W), the LUT 302 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. Similarly, slice 1 comprises a function generator implemented as a LUT 310 coupled to a multiplexer 312. The LUT 310 is adapted to receive input signals IN4-IN7, while the multiplexer 312 is coupled to receive the output of the LUT 310 and a registered value of Reg_DI_2. The output of the multiplexer 312 is coupled to a register 314 which generates an output Q2. The write control circuit 308 also generates a partial reset signal and an initial state signal for selectively resetting or setting one or more of the bits of the LUT 310. One advantage of resetting LUT memory elements of a device during partial reconfiguration is that it is not necessary to cycle through the required clock cycles to set the correct data after the partial reconfiguration.

Similarly, slice 2 comprises a function generator implemented as a LUT 322 coupled to a multiplexer 324. The LUT 322 is adapted to receive input signals IN8-IN11, while the multiplexer 324 is coupled to receive the output of the LUT 322 and a registered value of Reg_DI_3. The output of the multiplexer 324 is coupled to a register 326 which generates an output Q3. A Write Control Circuit 328 is coupled to receive RAM control signals and generate signals to control the LUT 322. In particular, input signals IN8-IN11 are decoded to generate an output associated with data stored in the LUT at the address designated by the input signals. The LUT 322 comprises a partial reset input (RST) for receiving a partial reset signal, and an initial state input (IS) for receiving an initial state signal. Similarly, slice 2 comprises a function generator implemented as a LUT 330 coupled to a multiplexer 332. The LUT 330 is adapted to receive input signals IN12-IN15, while the multiplexer 332 is coupled to receive the output of the LUT 330 and a registered value of Reg_DI_4. The output of the multiplexer 332 is coupled to a register 334 which generates an output Q4. The write control circuit 328 also generates a partial reset signal and an initial state signal for selectively resetting or setting one or more of the bits of the LUT 330.

Figure 4:
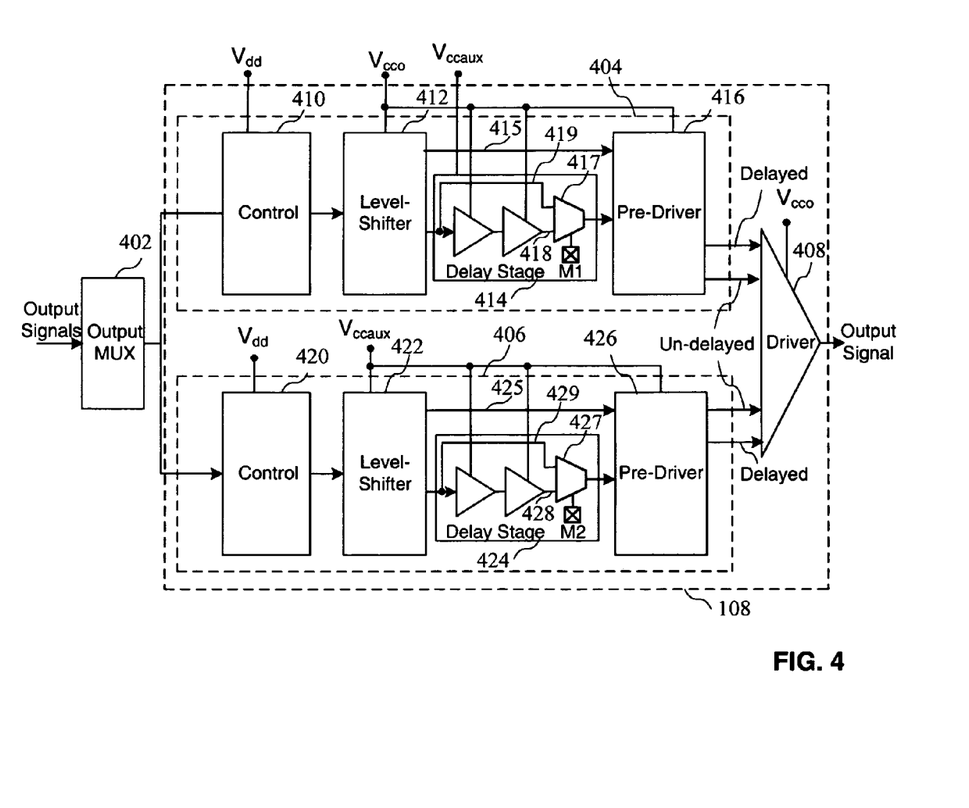
FIG. 4 is a block diagram of a portion of an input/output port having a delay stage according to an embodiment of the present invention.

Turning now to FIG. 4, a block diagram of an input/output port having a delay stage according to an embodiment of the present invention is shown. According to the embodiment of FIG. 4, two separately biased paths are provided between the output multiplexer 402 and the driver 408. In particular, a separate pull-up path 404 and pull-down path 406 are biased by voltages $V_{cco}$ and $V_{ccaux}$, respectively. The output signals from the logic circuit 104 are coupled to the output multiplexer 402 which outputs a selected signal to a control circuit 410, the output of which is coupled to a level shifter 412. The control circuit controls the data path by enabling or tri-stating the output driver. The control circuit also comprises a memory bit to turn on and off the stage. The level shifter 412 generates an appropriate voltage for the output signal. The output of the level shifter is coupled to a delay stage 414, which will be described in detail in reference to FIGS. 6 and 7. Both the output of the delay stage and the output of a undelayed path 415 are coupled to a pre-driver 416. The delay stage comprises a multiplexer 417 coupled to select one of a delay path 418 and a bypass path 419. The multiplexer may be controlled, for example, by a memory bit M1. As will be described in more detail below, the delay stage 414 also receives $V_{ccaux}$. The delay stage and the undelayed path enable a two-staged driver as described above to reduce the simultaneous switching noise. The control circuit 410, the level shifter 412, the pre-driver 416 and the driver 408 are well known in the art of input/output circuits. Each of the level shifter 412, the delay stage 414, the pre-driver 416, and the driver 408 are biased by the variable voltage $V_{cco}$, where $V_{cco}$ may vary from approximately 3.3 volts to 1.2 volts, for example, while the delay stage 414 is also biased by $V_{ccaux}$.

Similarly, the output of output multiplexer 402 is coupled to the pull-down path 406 at a control circuit 420, the output of which is coupled to a level shifter 422. The output of the level shifter is coupled to a delay stage 424, which is coupled to a pre-driver 426. The delay stage comprises a multiplexer 427 coupled to select one of a delay path 428 and a bypass path 429. The multiplexer may be controlled, for example, by a memory bit M2. Each of the level shifter 422, the delay stage 424, and the pre-driver 426 are biased by the fixed voltage $V_{ccaux}$, where $V_{ccaux}$ may be a fixed 2.5 volts, for example. While the delay stage described in FIGS. 6 and 7 may also be implemented in the pull-down path of FIG. 4, a conventional delay stage comprising inverters is preferably implemented. That is, because the pull-down path is biased by the fixed voltage $V_{ccaux}$, there is no need to implement a delay stage which will account for varying voltages. In addition to receiving a delayed output, a undelayed path 425 is coupled to the pre-driver. The delayed and un-delayed outputs of the pre-drivers will be coupled to a driver 408 to generate an output signal. A pull-up path of driver 408 coupled to the output of the pull-up path 404 comprises p-channel metal oxide semiconductor (PMOS) transistors, and a pull-down path of the driver 408 coupled to the output of the pull-down path 406 comprises n-channel metal oxide semiconductor (NMOS) transistors. Because the integrated circuit uses both the variable voltage $V_{cco}$ and the fixed voltage $V_{ccaux}$, the PMOS and NMOS transistors of the drivers may be biased separately to reduce the input/output capacitance. For example, by biasing the gate of the NMOS transistors of the driver with the fixed voltage $V_{ccaux}$, which may be greater than the variable voltage $V_{cco}$ for memory applications using 1.5 or 1.8 volts, the gate-to-source voltage ($V_{GS}$) of the NMOS transistors is maximized, thereby reducing the number of NMOS transistors which results in lower I/O capacitance and improves performance. Therefore, in addition to reducing the size of the input/output circuit by reducing the number of transistors, the I/O capacitance is also reduced.

Figure 5:
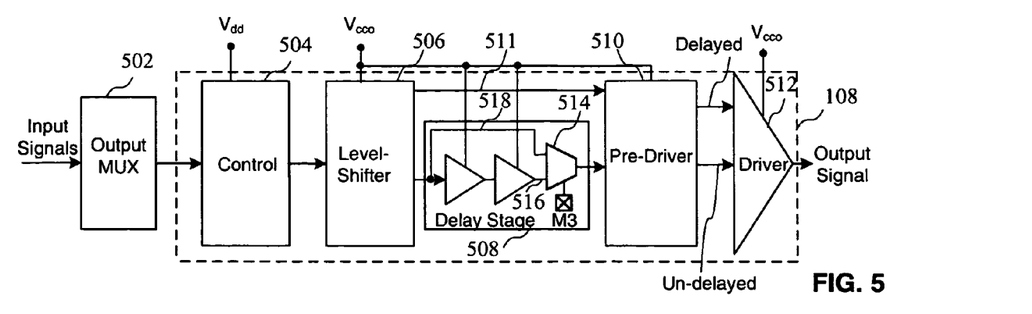
FIG. 5 is a block diagram of a portion of an input/output port having a delay stage according to an alternate embodiment of the present invention.

Turning now to FIG. 5, a block diagram of an input/output port having a delay stage according to an alternate embodiment of the present invention is shown. The input signals from the logic circuit 104 are coupled to an output multiplexer 502 which outputs a selected signal to a control circuit 504. The output of the control circuit 504 is coupled to a level shifter 506. The output of the level shifter is coupled to a delay stage 508, the output of which is coupled to a pre-driver 510. In addition to receiving a delayed output, the pre-driver will receive an un-delayed signal by way of an un-delayed path 511. The output of the pre-driver will be coupled to a driver 512 to generate an output signal, as is well known in the art. The output of the delay stage or the un-delayed signal will be selected by the pre-driver and the driver to reduce simultaneous switching noise. The delay stage comprises a multiplexer 514 coupled to select one of a delay path 516 and a bypass path 518. The multiplexer may be controlled, for example, by a memory bit M3. Each of the level shifter, the delay stage, and the pre-driver are biased by the variable voltage $V_{cco}$. The delay stage 508 may also be implemented according to the circuits of FIG. 6 or 7. While the circuit of FIG. 5 may also comprise pull-up and pull-down paths having CMOS transistors, the separate paths would not be separately biased, and are therefore shown in a single path. Further, unlike the embodiment of FIG. 4 where the delay stage for the pull-down path may comprise a conventional circuit having inverters, the delay stage for both the pull-up and pull-down paths of FIG. 5 is the same. That is, the circuit of FIG. 6 or 7 may be used for both the pull-up and pull-down paths to accommodate for the variable voltage $V_{cco}$ which is used to bias all of the transistors.

Figure 6:
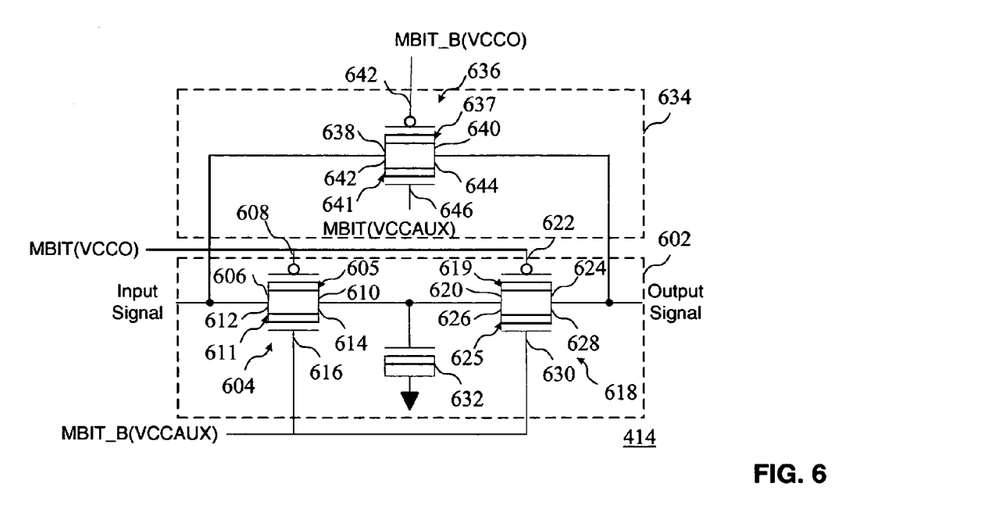
FIG. 6 is a circuit diagram of a delay stage according to an embodiment of the present invention.

Turning now to FIG. 6, a circuit diagram of a delay stage according to an embodiment of the present invention is shown. According to the embodiment of FIG. 6, full CMOS pass gates are used in the delay stage. Because the NMOS transistor passes a valid "0" and the PMOS transistor passes a valid "1," the CMOS pair eliminates the $V_T$ drop in a path having only NMOS transistors, which will be described in more detail in reference to FIG. 7. A delay path 602 comprises a CMOS transistor pair 604 having a PMOS transistor 605 receiving the input signal at a source 606. The transistor is preferably controlled by the signal MBIT(VCCO) at the gate 608 to enable passing the input signal to the drain 610. The corresponding NMOS transistor 611 comprises a drain 612 coupled to the source 606 and a source 614 coupled to the drain 610. A gate 616 is coupled to receive the complementary MBIT_B(VCCAUX) signal. The drain 610 of the transistor 611 is coupled a second CMOS transistor pair 618 comprising a p-channel transistor 619. A source 620 of the transistor 619 is coupled to the drain 610 of the transistor 605. A gate 622 coupled to receive the signal MBIT(VCCO) is used to control the transistor 619 to enable generating an output signal at the source 624. An n-channel transistor 625 comprises a drain 626 coupled to the source 620 of transistor 619 and a source 628 coupled to a drain 624 of transistor 619. A gate 630 is controlled by the MBIT_B(VCCAUX) signal. A capacitor 632 has a first terminal coupled to the common drain/source pairs of the CMOS pairs and a second terminal coupled to ground. The capacitor may comprise an NMOS transistor, for example. A bypass path 634 enables bypassing the delay path to boost performance if required, such as in a memory application operating on a voltage of 1.5 volts or 1.8 volts. The bypass path 634 comprises a CMOS transistor pair 636 having a PMOS transistor 637 providing a path from a source 638 to a drain 640 and controlled by an MBIT_B (VCCO) signal on the gate 642. An NMOS transistor 641 comprises a drain 642 also coupled to receive the input signal and a source 644 coupled to the output. The NMOS transistor 641 is controlled by the MBIT(VCCAUX) signal at the gate 646.

The circuit of FIG. 6 takes advantage of the dual voltage supplies in implementing a robust and predictable delay to support a wide power supply range. In operation, when the MBIT is low, the delay path is used and when the MBIT is high the bypass path is used. The gates of transistors 611, 625 and 641 are biased by either MBIT(VCCAUX) or MBIT_B (VCCAUX) which are based upon the fixed power supply $V_{ccaux}$ whereas the gates of transistors 605, 619, and 637 are biased by either MBIT(VCCO) or MBIT_B(VCCO) which are based upon the variable power supply $V_{cco}$ that varies depending on the I/O interface being supported. When the MBIT signal is low (i.e., MBIT(VCCO) and MBIT(VCCAUX) are low) and the input signal is also low, the output will be driven low through transistors 611 and 625. However, when MBIT is low and the input signal is high (i.e., the level that varies with I/O interface used), the output will be driven high through 605, 611, 619 and 625. To pass a high signal through the delay stage, the PMOS transistors 605 and 619 are assisted by the NMOS transistors 611 and 625 because of the fixed voltage MBIT_B(VCCAUX) based upon $V_{ccaux}$ on the gates of transistors 611 and 625. In order to bypass the delay, MBIT is forced high and the bypass path comprising of transistors 637 and 641 is used. As set forth above, the delay may be bypassed when the variable supply voltage $V_{cco}$ is low enough that a delay is provided by the slower switching times of the transistors.

Figure 7:
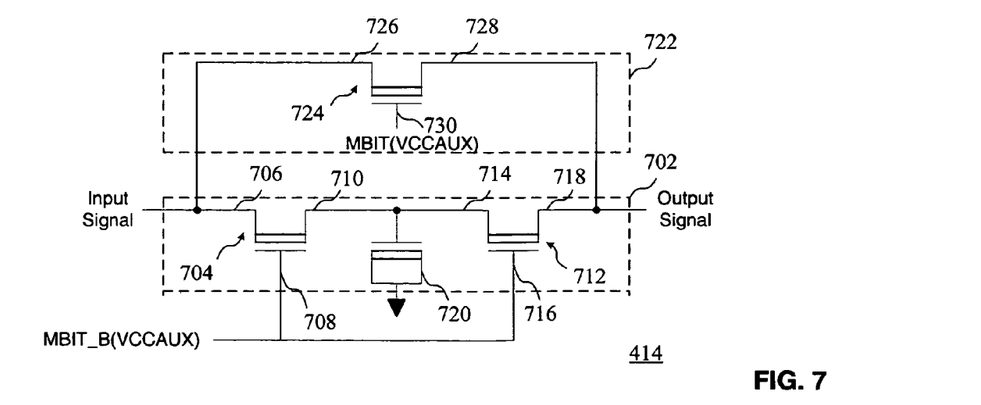
FIG. 7 is a circuit diagram of a delay stage according to an alternate embodiment of the present invention.

Turning now to FIG. 7, a circuit diagram of a delay stage according to an alternate embodiment of the present invention is shown. The delay stage also consists of two paths controlled by memory bit MBIT, which will select which of the two paths is used to couple the signal to the pre-driver. The selection of the memory bit may be downloaded with the bitstream used to configure the device. According to the embodiment of FIG. 7, an input signal is coupled to the delay path 702 of the delay stage 414. The delay path 702 comprises a first NMOS transistors 704 coupled to receive the input signal at a drain 706. A gate 708 of transistor 704 is coupled to receive the complement control signal MBIT_B to enable the input signal to pass to the source 710. The source 710 is coupled a second transistor 712 at a drain 714. A gate 716 is used to control the second transistor 712 to enable generating an output signal at the source 718. A capacitor 720 has a first terminal coupled to the source 710 and the drain 714, and a second terminal coupled to ground. The capacitor 720 may comprise an NMOS transistor. Alternatively, a PMOS transistor may be used as a capacitive load. With NMOS pass gate structure using transistors 704 and 712, the gate voltage needs to be a threshold voltage $V_T$ higher than the drain voltage. Although a single pass gate stage is shown, multiple pass gate stages may be used to create a delay stage. That is, the elements of the delay path 702 may be replicated and buffered to provide additional delay.

According to another aspect of FIG. 7, a bypass path 722 also enables bypassing the delay path to boost performance if required. In particular, a transistor 724 comprises a drain 726 coupled to receive the input signal. The transistor 724 may comprise an NMOS transistor and is controlled by the MBIT signal at the gate 730 to enable the generation of the output signal at the source 728. The delay path is used when MBIT is low and MBIT_B is high, while the bypass path is used when MBIT is high and MBIT_B is low. Although the transistors are shown as biased by MBIT(VCCO) and MBIT_B (VCCO), the transistors may be biased by the MBIT(VCCAUX) and MBIT_B(VCCAUX) signals. Because the bypass path is not coupled to capacitor 720, the bypass path will provide a very small delay. The use of the pass gate structures in FIGS. 6 and 7 provides a more predictable delay through the stage regardless of the voltage supply level. As the variable power supply is lowered, the drive for the transistors of the inverters employed in conventional circuits is reduced, thereby increasing the delay through the stage. However, it is beneficial to keep the delay through the stage fixed across the power supply range. Unlike conventional devices based on a chain of inverters where the delay is not fixed, the circuit of FIGS. 6 and 7 enables a fixed delay regardless of the voltage supply. Although the delay may vary slightly based upon the different supply voltages, the delay is substantially fixed compared to a delay generated by inverters of a conventional circuit. Accordingly, the supply voltage may be changed to support different I/O interfaces. Finally, the bypass path or the delay path may be selected separately for each of the input/output ports 108 to accommodate an application having a lower voltage using the input/output port.

Figure 8:
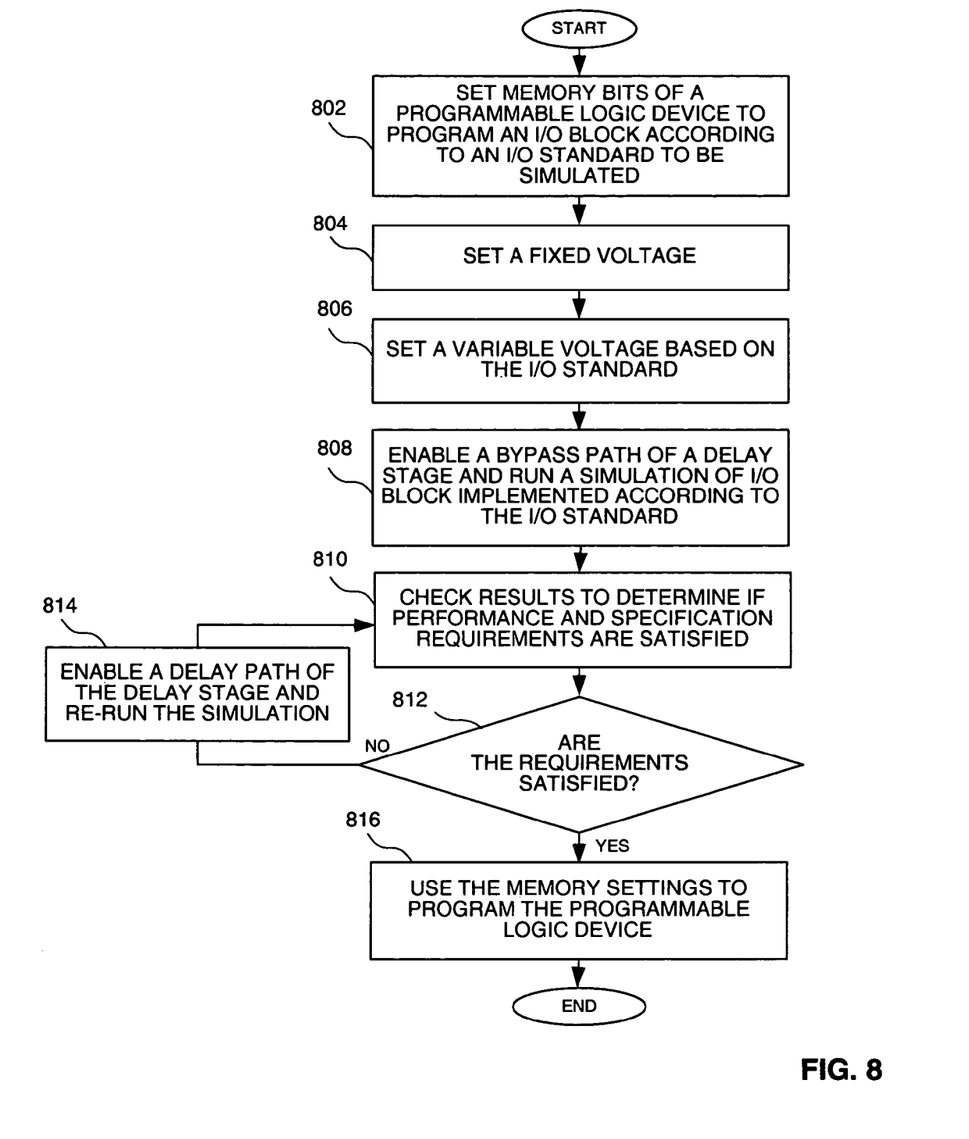
FIG. 8 is a flow chart showing a method of generating a delay in an input/output port of an integrated circuit according to an embodiment of the present invention.

Turning now to FIG. 8, a flow chart shows a method of generating a delay in an input/output port of an integrated circuit according to an embodiment of the present invention. According to one embodiment of the invention, an I/O block implemented according to a given standard may be simulated to determine whether to implement a delay stage or a bypass path in the I/O block, as described above. In particular, the correct path to implement when an I/O block is implemented in a programmable logic device may be determined through simulation of the I/O block, for example. In order to determine the correct path to implement in the programmable logic device, memory bits of a programmable logic device are set to program an I/O block according to an I/O standard to be simulated at a step 802. A fixed voltage is set at a step 804. A variable voltage is set based on the I/O standard at a step 806. A bypass path is enabled and a simulation of an I/O block implemented according to the I/O standard is run at a step 808. The results are checked to determine if performance and specification requirements are satisfied at a step 810. For example, the requirements may include AC performance parameters such as simultaneous switching noise as described above. It is then determined whether the requirements are satisfied at a step 812. If not, a delay path is enabled and the simulation is re-run at a step 814. If the requirements are satisfied, the settings of the memory bits are used to program the programmable logic device at a step 816. The method of FIG. 8 may be employed using any of the circuits of FIGS. 1-7, or some other suitable circuit, and simulated using any suitable simulation tool for a given programmable logic device.

It can therefore be appreciated that the new and novel circuit for and method of generating a delayed output in an input/output stage of a device adapted to implement circuits operating on a range of voltages has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for generating a delayed output in an input/output port of a device adapted to implement circuits operating on a range of voltages, said circuit comprising:
    a first terminal of a delay stage of said input/output port coupled to receive a signal to be output by said circuit;
    a first pass gate coupled to said first terminal;
    a capacitor having a first terminal coupled to the output of said first pass gate and a second terminal coupled to ground;
    a second pass gate coupled to said first terminal of said capacitor;
    a second terminal of said delay stage of said input/output port coupled to the output of said second pass gate and outputting a delayed signal; and
    a bypass gate coupled to said first terminal and said second terminal.

2. The circuit of claim 1 wherein said first pass gate and said second pass gate comprise first and second CMOS pass gates.

3. The circuit of claim 2 wherein said bypass gate comprises a third CMOS pass gate.

4. The circuit of claim 3 wherein said bypass gate is selected when a bias voltage coupled to said first pass gate and said second pass gate comprises a low voltage.

5. The circuit of claim 3 wherein NMOS transistors of said CMOS pass gates are biased by a fixed voltage supply and PMOS transistors of said CMOS pass gate are biased by a variable voltage supply.

6. The circuit of claim 1 wherein said device comprises a programmable logic device.

7. A circuit for generating a delayed output in an input/output port of a device adapted to implement circuits operating on a range of voltages, said circuit comprising:
    a first terminal coupled to receive a signal to be output by said input/output port;
    a first delay path comprising a first pass gate coupled to said first terminal, a first capacitor coupled to the output of said first pass gate, and a second pass gate coupled to said first capacitor at the output of said first pass gate;
    a second delay path coupled to said first terminal; and
    a second terminal coupled to outputs of said first delay path and said second delay path to generate a delayed signal based upon said signal received at said first terminal.

8. The circuit of claim 7 wherein said first delay path further comprises a first bypass path.

9. The circuit of claim 7 further comprising a pull-up path of a driver having at least one PMOS transistor.

10. The circuit of claim 7 further comprising a pull-down path of a driver having at least one NMOS transistor.

11. The circuit of claim 7 wherein said first delay path is biased by a variable input voltage.

12. The circuit of claim 7 wherein said second delay path comprises a series of inverters.

13. The circuit of claim 12 wherein said second path is biased by a fixed input voltage.

14. A method of generating a delayed output in an input/output port of a device adapted to implement circuits operating on a range of voltages, said method comprising the steps of: setting a fixed input voltage at an input/output block of said device; setting a variable voltage at said input/output block of said device; providing a delay stage to an output driver of an input/output port of said input/output block, said delay stage comprising a delay path and a bypass path; providing a capacitor coupled between a node on the delay path and ground; and determining whether to select said delay path or said bypass path to generate a signal to said output driver.

15. The method of claim 14 wherein said step of determining whether to select said delay path or said bypass path comprises a step of determining whether to select said delay path or said bypass path based upon a level of said variable voltage.

16. The method of claim 15 further comprising a step of determining whether performance requirements are satisfied.

17. The method of claim 16 further comprising a step of switching from a selected path of said delay path and said bypass path to a non-selected path if said performance requirements are not satisfied.

18. The method of claim 17 further comprising a step of determining whether performance requirements are satisfied after said step of switching.

19. The method of claim 14 further comprising a step of configuring a programmable logic device to select either said delay path or said bypass path based on said step of determining.

* * * * *